United States Patent
Wu et al.

(10) Patent No.: US 6,797,564 B1
(45) Date of Patent: Sep. 28, 2004

(54) METHOD OF FORMING BIT LINES AND BIT LINE CONTACTS IN A MEMORY DEVICE

(75) Inventors: Kuo-Chien Wu, Miaoli (TW); Yi-Nan Chen, Taipei (TW)

(73) Assignee: Nanya Technology Corp., Taoyuan (TW)

( * ) Notice: Subject to any disclaimer, the term of this patent is extended or adjusted under 35 U.S.C. 154(b) by 0 days.

(21) Appl. No.: 10/605,401

(22) Filed: Sep. 29, 2003

(30) Foreign Application Priority Data

Sep. 9, 2003 (TW) ........................................ 92124834 A

(51) Int. Cl.⁷ .......................................... H01L 21/336
(52) U.S. Cl. ...................................... 438/257; 438/592
(58) Field of Search ................................ 438/238, 257, 438/381, 396, 595, 692

(56) References Cited

U.S. PATENT DOCUMENTS 5,728,627 A * 3/1998 Nam et al. .................. 438/618
6,071,799 A * 6/2000 Park et al. .................. 438/595
6,228,700 B1 * 5/2001 Lee ............................ 438/238

* cited by examiner

*Primary Examiner*—Phuc T. Dang
(74) *Attorney, Agent, or Firm*—Jiang Chyun IP Office

(57) ABSTRACT

A method for forming bit lines and bit line contacts in a memory device is provided. A conductive layer is formed over a substrate to cover a plurality of gate structures thereon. A chemical-mechanical polishing operation is performed to polish the conductive layer so that a cap layer of the gate structures is exposed. A portion of the conductive layer is removed so that only the conductive layer between two neighboring gate structures is retained to serve as a bit line contact. A bit line is formed over the substrate such that the bit line and the bit line contact are electrically connected. Because the bit line contact has a smaller dimension compared with a bit line contact formed using the conventional method, the possibility of having a short circuit between a bit line contact and an adjacent bit line is reduced.

16 Claims, 6 Drawing Sheets

METHOD OF FORMING BIT LINES AND BIT LINE CONTACTS IN A MEMORY DEVICE

CROSS REFERENCE TO RELATED APPLICATIONS

This application claims the priority benefit of Taiwan application serial no. Sep. 9, 2003, filed 92124834.

BACKGROUND OF INVENTION

1. Field of the Invention

The present invention relates to a method of forming a semiconductor device. More particularly, the present invention relates to a method of forming bit lines and bit line contacts of a dynamic random access memory.

2. Description of the Related Art

Memory is a semiconductor device for holding data or parameters. In a digital device, memory capacity is often expressed in term of the number of bits that can be held. Each memory unit for storing a single bit of data is called a memory cell. In general, the memory cells are organized into a memory array with the address of each memory cell specified through the intersection of a particular row and column. The memory cells in a row or a column is serially connected together via a common conductive wire. A dynamic random access memory is a memory device that utilizes the charged or uncharged state of a capacitor to store a bit of binary data. Each capacitor is capable of representing a single bit of memory data. Typically, a fully charged capacitor represents the storage of a binary bit "1" and a fully discharged capacitor represents the storage of a binary bit "0". Similarly, the memory cells in a dynamic random access memory are connected serially together through a common conductive wire. All the serially connected memory cells in a row (or a column) is referred to as a word line and the conductive wires related to the transmission of data is called bit lines.

FIG. 1 is a schematic cross-sectional view showing a bit line and bit line contact of a conventional dynamic random access memory. As shown in FIG. 1, a conventional memory device comprises substrate 100 with a plurality of gate structures 108 thereon. Each gate structure 108 comprises a gate dielectric layer 102, a gate conductive layer 104 and a cap layer 106. Furthermore, spacers 110 are formed on the sidewalls of the gate structures 108. A dielectric layer 112 is also formed over the substrate 100 covering the gate structures 108. The dielectric layer 112 has a bit line contact 114 therein. In general, a self-aligned contact process is performed to fabricate the bit line contact 114. A bit line 116 is also formed over the dielectric layer 112 such that the bit line 116 and the bit line contact 114 are electrically connected.

Since a self-aligned contact process is used to form the bit line contact 114 of a conventional memory device, the top surface area of the bit line contact 114 is quite large.

FIG. 2 is a top view of the structure shown in FIG. 1. As shown in FIG. 2, the bit lines 116 cross over the gate structures 108 and the bit line contact 114 is located underneath the bit line 116 between two adjacent gate structures 108. Because the bit line contact 114 has a larger dimension, the distance "a" between the bit line contact 114 and the bit line 116 is smaller than the distance "b" between the two bit lines 116. If there is a slight shift in the pattern layout due to processing variation, the probability of having a short circuit between the bit line contact 114 and adjacent bit line 116 is increased.

SUMMARY OF INVENTION

Accordingly, one object of the present invention is to provide a method of forming bit lines and bit line contacts of a memory device in a manner to prevent a possible short-circuit between a bit line contact and an adjacent bit line.

To achieve these and other advantages and in accordance with the purpose of the invention, as embodied and broadly described herein, the invention provides a method of forming bit lines and bit line contacts of a memory device. First, a substrate having a plurality of gate structures formed thereon is provided. Each gate structure further comprises a gate dielectric layer, a gate conductive layer and a cap layer. Furthermore, spacers are formed on the sidewalls of each gate structures. Thereafter, a barrier layer is formed over the substrate to cover the gate structures. The barrier layer between two adjacent gate structures is removed to expose a portion of the substrate. A conductive layer is deposited over the substrate to cover the gate structures. The conductive layer is fabricated using doped polysilicon material, for example. Thereafter, a chemical mechanical polishing is performed to planarize the conductive layer until the cap layer of the gate structures is exposed. A portion of the conductive layer is removed so that the conductive layer between the two adjacent gate structures is retained to form a bit line contact. A dielectric layer is formed over the substrate to cover the gate structures. The dielectric layer is planarized to expose cap layer of the gate structures. A stop layer is formed over the substrate to cover the dielectric layer and the gate structures but exposes the bit line contact. A first dielectric layer is formed over the stop layer and then a trench is formed within the first dielectric layer to expose the bit line contact. A conductive material is deposited into the trench to form a bit line. The bit line and the bit line contacts are electrically connected such that the bit line contact has a width almost identical to the bit line.

This invention also provides a method of forming a memory device. First, a substrate having a memory cell region and a peripheral circuit region is provided. Thereafter, a plurality of gate structures is formed in the memory cell region. Each gate structure comprises a gate dielectric layer, a gate conductive layer and a cap layer. Spacers are formed on the sidewalls of the gate structures. A barrier layer is formed over the substrate to cover the gate structures. The barrier layer between two adjacent gate structures is removed to expose a portion of the substrate. A conductive layer is deposited over the substrate to cover the gate structures. The conductive layer is fabricated using doped polysilicon material, for example. Thereafter, a chemical mechanical polishing is performed to planarize the conductive layer until the cap layer of the gate structures is exposed. A portion of the conductive layer is removed so that the conductive layer between the two adjacent gate structures is retained to form a bit line contact. A dielectric layer is formed over the substrate to cover the gate structures. The dielectric layer is planarized to expose cap layer of the gate structures. A stopping layer is formed over the substrate to cover the dielectric layer and the gate structures but exposes the bit line contact. A first dielectric layer is formed over the stopping layer and then a trench is formed within the first dielectric layer to expose the bit line contact. An opening is formed in the dielectric layer within the peripheral circuit region to expose a portion of the substrate. A conductive material is deposited into the trench to form a bit line and a contact. The bit line is electrically connected to the bit line contact within the memory cell region and the contact within the peripheral circuit region such that the bit line contact has a width almost identical to the bit line.

Since the dimension of the bit line contact in this invention is smaller than a bit line contact formed by a conventional method, the probability of having a short circuit between a bit line contact and its adjacent bit line is greatly reduced.

Furthermore, forming a stopping layer underneath the bit line ensures the thickness of the bit line above the memory device is uniform.

In addition, the contact openings in the peripheral circuit region are defined at the bottom of the trench after the trench is formed. Hence, the contact openings can be easily formed because of a lower aspect ratio.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
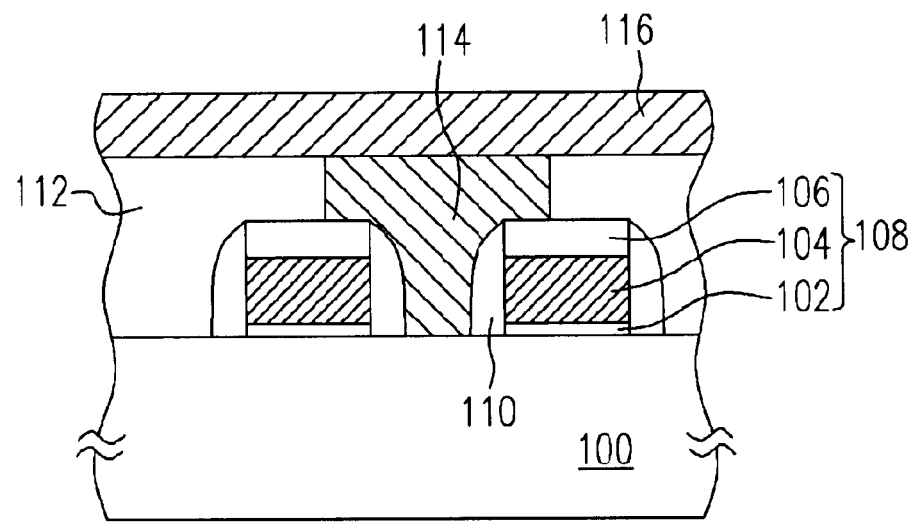
FIG. 1 is a schematic cross-sectional view showing a bit line and bit line contact of a conventional dynamic random access memory.
Figure 2:
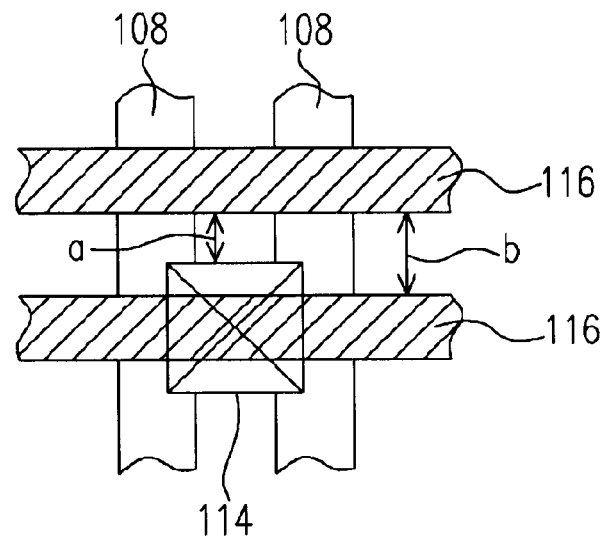
FIG. 2 is a top view of the structure shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
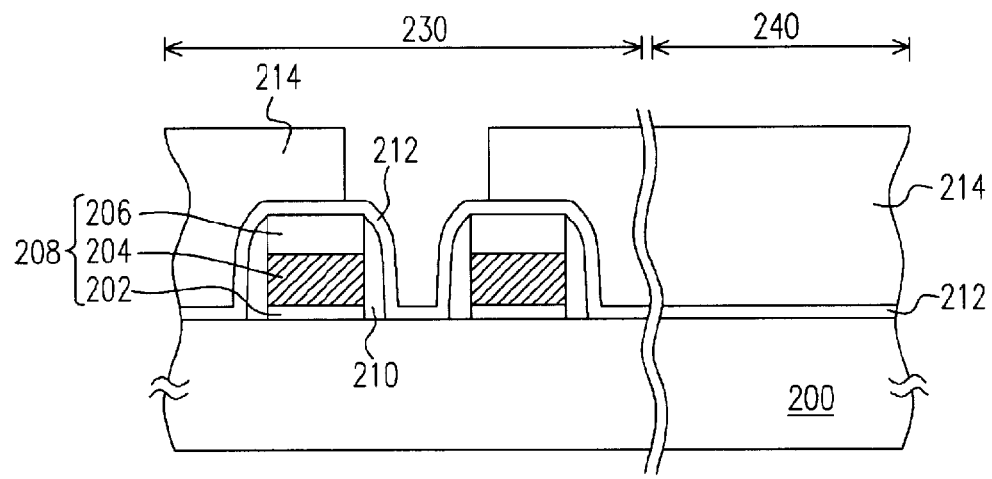
FIGS. 3A through 3I are schematic cross-sectional views showing the progression of steps of a method of fabricating bit lines and bit line contacts of a memory device according to one preferred embodiment of this invention.

FIGS. 3A through 3I are schematic cross-sectional views showing the progression of steps of a method of fabricating bit lines and bit line contacts of a memory device according to one preferred embodiment of this invention. As shown in FIG. 3A, a substrate 200 comprising a memory cell region 230 and a peripheral circuit region 240 is provided. A plurality of gate structures 208 is formed over the substrate 200 within the memory cell region 230. Each gate structure 208 comprises a gate dielectric layer 202, a gate conductive layer 204 and a cap layer 206. Furthermore, spacers 210 are formed on the sidewalls of the gate structures 208. In one embodiment, the gate dielectric layer 202 is a silicon oxide layer, the gate conductive layer 204 is a polysilicon layer and both the cap layer 206 and the spacers 210 are silicon nitride layers, for example.

A conformal barrier layer 212 is formed over the substrate 200 to cover the gate structure 208 and the upper surface of the substrate 200. In one preferred embodiment, the barrier layer 212 is a silicon nitride layer, for example. Thereafter, a patterned photoresist layer 214 is formed over the substrate 200. The photoresist layer 214 exposes an area between two adjacent gate structures 208 for forming a bit line contact. Using the photoresist layer 214 as a mask, a portion of the barrier layer 212 is removed to form a patterned barrier layer 212a. The patterned barrier layer 212a exposes a substrate area for forming a bit line contact.

Figure 3B:
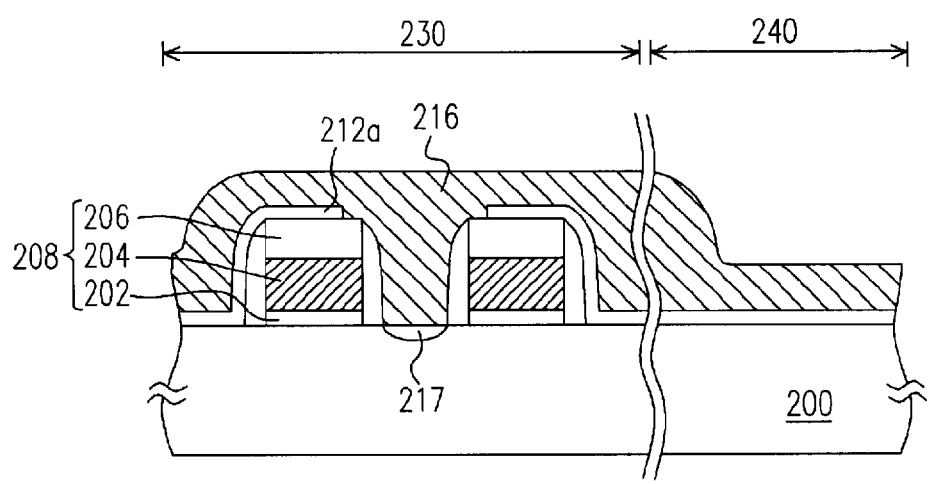

As shown in FIG. 3B, the photoresist layer 214 is removed and a conductive layer 216 is formed over the substrate 200 to cover the gate structures 208. In one preferred embodiment, the conductive layer 216 is a doped polysilicon layer, for example. It is to be noted that if the conductive layer 216 is fabricated from a doped polysilicon, the dopants within the doped polysilicon may diffuse into the substrate 200 to form a lightly doped region 217. However, dopants are prevented from diffusing into substrate areas with the barrier layer 212a so that the lightly doped region 217 is formed only in the substrate area designated for forming the bit line contacts (with the barrier layer removed in a previous step).

Figure 3C:
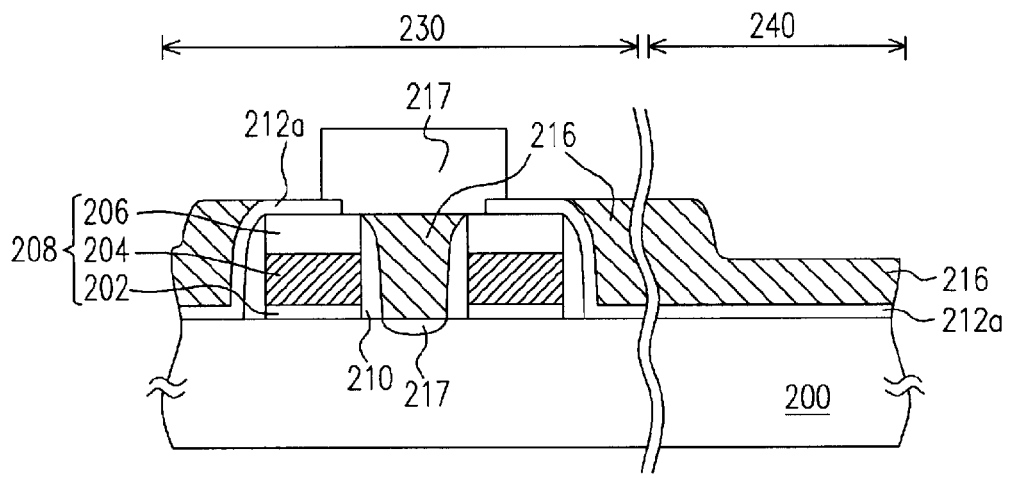
Figure 3D:
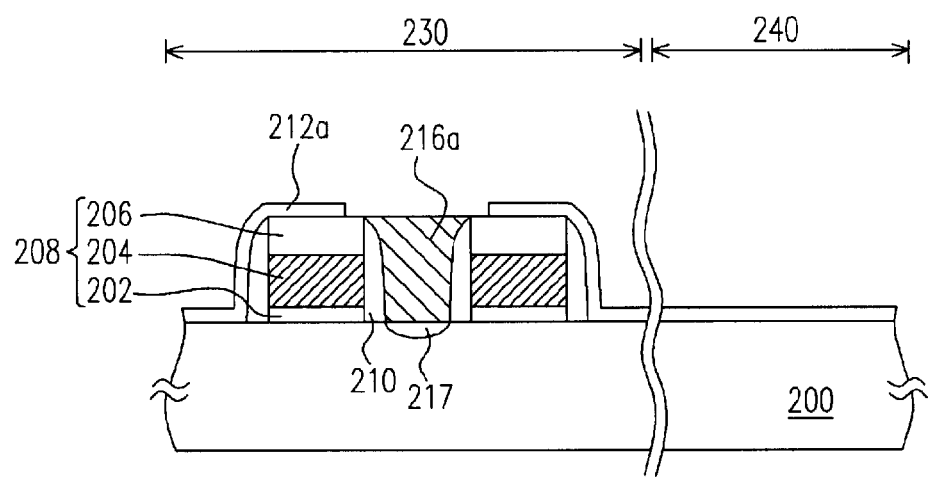

As shown in FIG. 3C, the conductive layer 216 is planarized to expose the barrier layer 212a above the gate structures 208 or the cap layer 206 of the gate structures. The conductive layer 216 is planarized, for example, by performing a chemical-mechanical polishing operation. Another patterned photoresist layer 217 is formed over the conductive layer 216. Thereafter, using the photoresist layer 217 as a mask, an etching operation is carried out to remove the exposed conductive layer 216 so that a bit line contact 216a (as shown in FIG. 3D) is formed. In other words, the remaining conductive layer 216 becomes the bit line contact 216a.

Figure 3E:
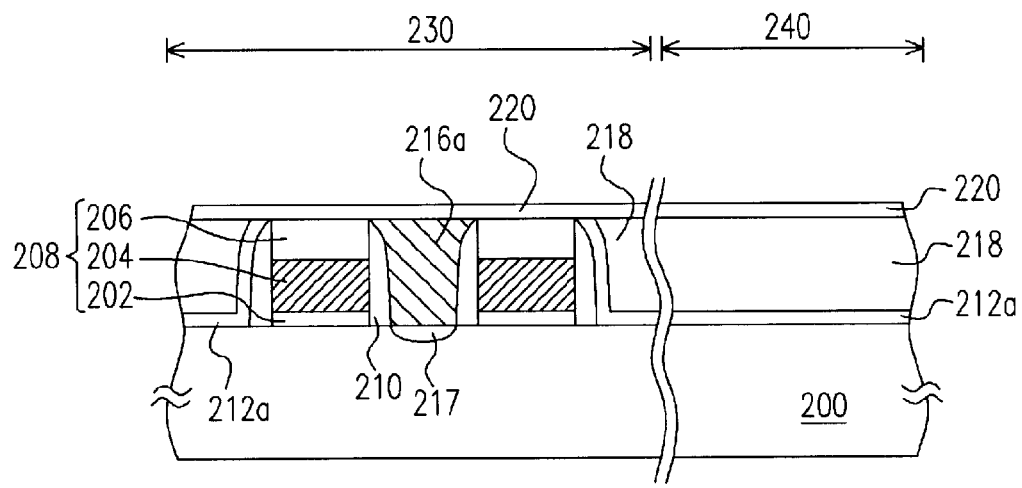

As shown in FIG. 3E, the photoresist layer 217 is removed. A dielectric layer 218 is formed over the substrate 200. The upper surface of the dielectric layer 218 is coplanar with the upper surface of the cap layer 206 of the gate structures 208. The dielectric layer 218 is fabricated using a silicon oxide material such as borophosphosilicate (BPSG) glass. The dielectric layer 218 is formed, for example, by depositing a dielectric material over the substrate 200 to cover the gate structures and the bit line contact 216a and performing a chemical-mechanical polishing operation to remove excess material and expose the cap layer 206 and the bit line contact 216a. Thereafter, a stop layer 220 is formed over the substrate 200 to cover the dielectric layer 218, the gate structures 208 and the bit line contact 216a. In one preferred embodiment, the stopping layer 220 is a silicon nitride or a silicon oxynitride layer, for example.

Figure 3F:
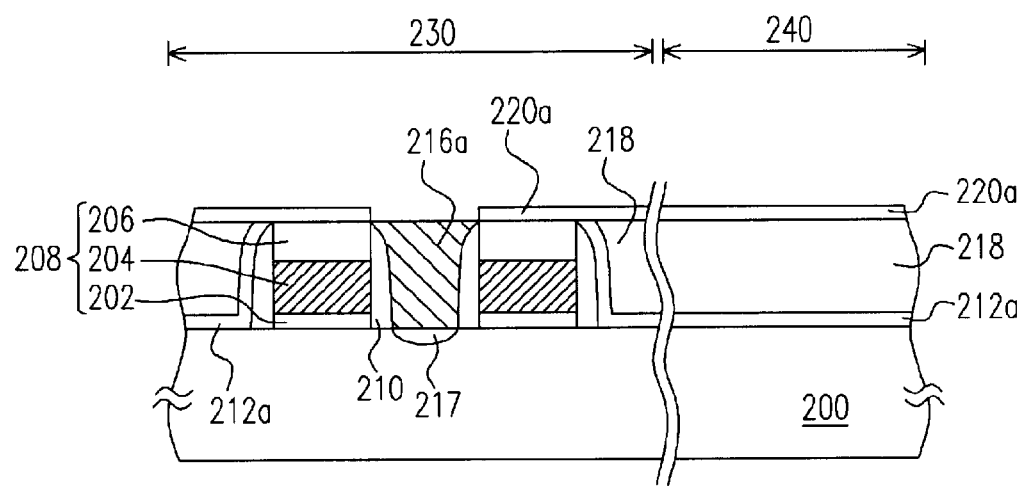
Figure 3G:
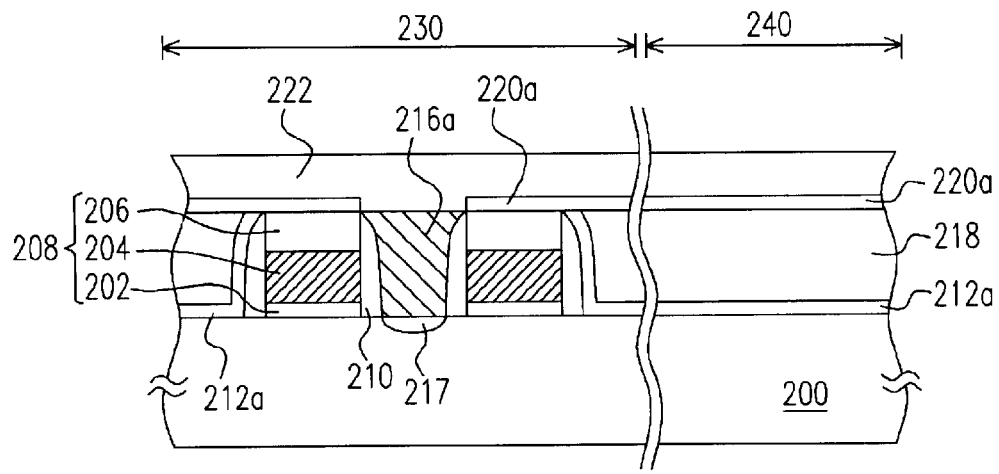

As shown in FIG. 3F, the stop layer 220 is patterned by performing a photolithographic process and an etching process in sequence to form a stop layer 220a and thereby exposing the bit lint contact 216a. As shown in FIG. 3G, another dielectric layer 222 is formed over the stop layer 220a. The dielectric layer 222 has a high etching selectivity relative to the stopping layer 220a. In other words, the dielectric layer 222 has a higher etching rate than the stop layer 220a. In one preferred embodiment, the dielectric layer 222 is a silicon oxide layer, for example.

Figure 3H:
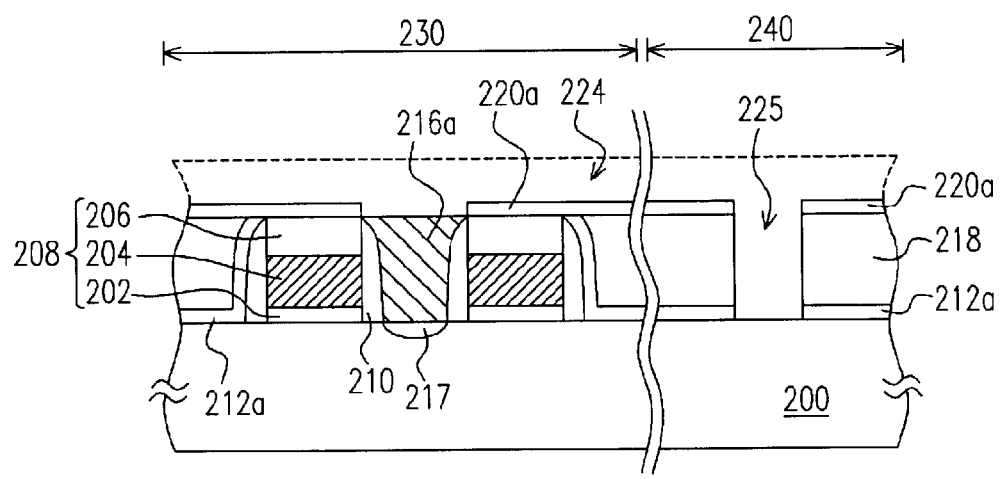

As shown in FIG. 3H, the dielectric layer 222 is patterned by performing a photolithographic process and an etching process in sequence to form a trench pattern 224, wherein the bit line contact 216a is exposed within the trench 224. Here, since the stop layer 220a is formed underneath the dielectric layer 222, the etching operation automatically stops on the stopping layer 220a. Thus, a uniform depth is ensured for each trench 224. Thereafter, another photolithographic and etching processing sequence is carried out to remove a portion of the stopping layer 220a, the dielectric layer 218 and the barrier layer 212a underneath the trenches 224 within the peripheral circuit region 240 and form an opening 225.

Figure 3I:
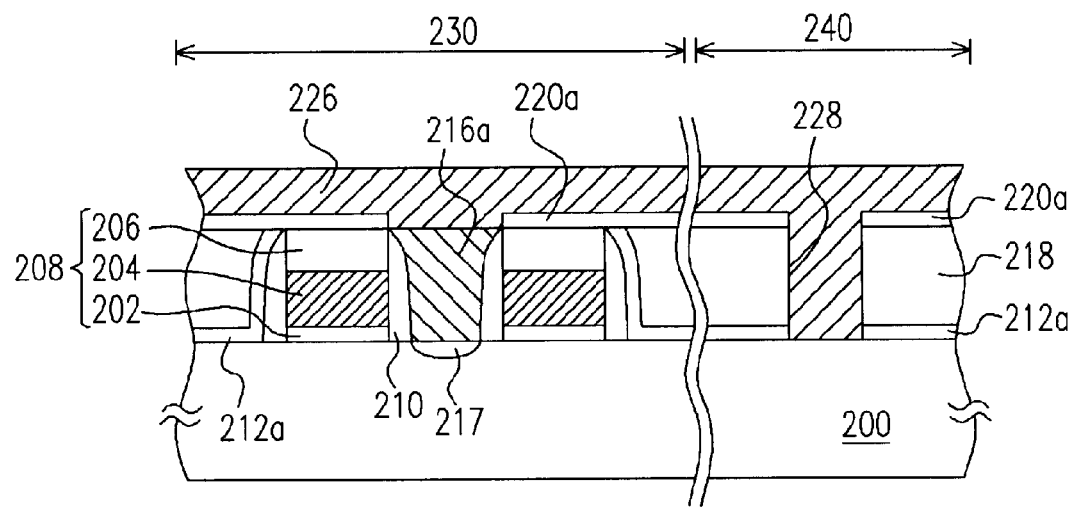

As shown in FIG. 3I, a conductive material is deposited into the trenches 224 and the opening 225 to form a bit line 226 and a contact 228 respectively. The bit line 226 is electrically connected to the bit line contact 216a within the memory cell region 230 and the contact 228 within the peripheral circuit region 230. The bit line 226 and the contact 228 are fabricated using a metallic material such as tungsten. The bit line 226 and the contact 228 are formed, for example, by depositing tungsten over the substrate 200 to fill the trench 224 and the opening 225 and then performing a chemical-mechanical polishing operation to remove excess tungsten material and expose the dielectric layer 222.

Figure 4:
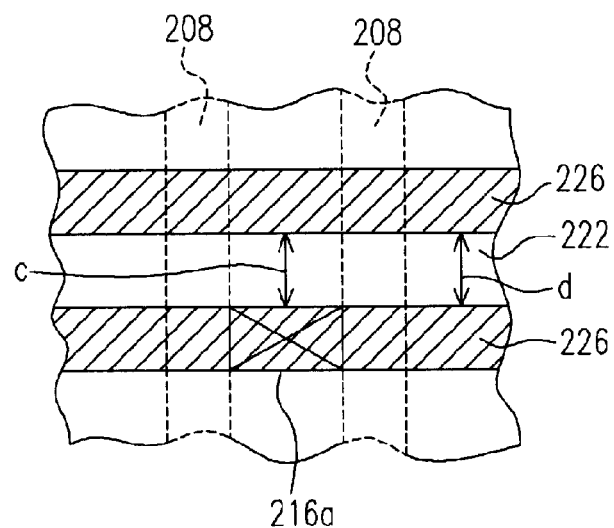
FIG. 4 is a top view of the memory cell region shown in FIG. 3I.

FIG. 4 is a top view of the memory cell region shown in FIG. 3I. As shown in FIG. 4, the bit lines 226 cross over the gate structures 208 with the dielectric layer 222 filling the space between the bit lines 226. In particular, the bit line contact 216a underneath the bit line 226 has a width almost identical to the bit line 226. In other words, the distance "c" between the bit line contact 216a and its adjacent bit line 226 is almost identical to the distance "d" between the pair of adjacent bit lines 226. Therefore, the dimension of the bit line contact 216a is considerably smaller than the bit line contact produced by a conventional fabricating method. Ultimately, the possibility of having a short circuit between a bit line contact 216a and an adjacent bit line 226 is greatly reduced.

In summary, major advantages of this invention includes: 1. Since the dimension of the bit line contact in this invention is smaller than a bit line contact formed by a conventional method, the probability of having a short circuit between a bit line contact and its adjacent bit line is greatly reduced. 2. By forming a stopping layer underneath the bit line ensures, the bit line has a uniform thickness above the memory device is uniform. 3. The contact openings in the peripheral circuit region are defined at the bottom of the trench after the trench is formed. Hence, the contact openings can be formed because of a lower aspect ratio.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming bit lines and bit line contacts of a memory device, comprising the steps of:

providing a substrate having a plurality of gate structures thereon, wherein each gate structure comprises a gate dielectric layer, a gate conductive layer and a cap layer, and wherein a spacer is formed on each sidewall of the gate structure;

forming a conductive layer over the substrate to cover the gate structures;

planarizing the conductive layer until the cap layer of the gate structures is exposed;

removing a portion of the conductive layer but retaining the conductive layer between neighboring gate structures to form a bit line contact;

forming a dielectric layer over the substrate to cover the gate structures and the bit line contact;

planarizing the dielectric layer until the cap layer of the gate structures and the bit line contact are exposed;

forming a stop layer over the dielectric layer such that the bit line contact remains exposed; and forming a bit line over the stop layer, wherein the bit line and the bit line contact are electrically connected.

2. The method of claim 1, wherein before forming the conductive layer over the substrate, further comprises:

forming a barrier layer over the substrate and the gate structures; and removing the barrier layer between two neighboring gate structures to expose the substrate.

3. The method of claim 1, wherein the step of forming the bit line over the dielectric layer comprises:

forming a first dielectric layer over the dielectric layer;

forming a trench in the first dielectric layer such that the trench exposes the bit line contact; and depositing conductive material into the trench to form the bit line.

4. The method of claim 1, wherein the step of planarizing the conductive layer comprises performing a chemical mechanical polishing operation.

5. The method of claim 1, wherein the step of planarizing the dielectric layer comprises performing a chemical mechanical polishing operation.

6. The method of claim 1, wherein a width of the bit line contact is substantially identical to a width of the bit line.

7. The method of claim 1, wherein material constituting the bit line contact comprises doped polysilicon.

8. The method of claim 1, wherein material constituting the bit line comprises tungsten.

9. A method of forming a memory device, comprising the steps of:

providing a substrate comprising a memory cell region and a peripheral circuit region;

forming a plurality of gate structures over the substrate within the memory cell region, wherein each gate structure comprises a gate dielectric layer, a gate conductive layer and a cap layer, and wherein a spacer is formed on each sidewall of the gate structures;

forming a conductive layer over the substrate to cover the gate structures;

planarizing the conductive layer until the cap layer of the gate structures is exposed;

removing a portion of the conductive layer but retaining the conductive layer between two neighboring gate structures to form a bit line contact;

forming a dielectric layer over the substrate to cover the gate structures and the bit line contact;

planarizing the dielectric layer until the cap layer of the gate structures and the bit line contact are exposed;

forming a stop layer over the dielectric layer such that the stop layer exposes the bit line contact; and forming a bit line over the stop layer so that a contact is also formed within the dielectric layer in the peripheral circuit region, wherein the bit line is electrically connected to both the bit line contact and the contact.

10. The method of claim 9, wherein before the step of forming the conductive layer over the substrate, further comprises:

forming a barrier layer over the substrate and the gate structures; and removing the barrier layer between two neighboring gate structures to expose the substrate.

11. The method of claim 9, wherein the step of planarizing the conductive layer comprises performing a chemical mechanical polishing operation.

12. The method of claim 9, wherein the step of planarizing the dielectric layer comprises performing a chemical mechanical polishing operation.

13. The method of claim 9, wherein the bit line contact has a width almost identical to the bit line.

14. The method of claim 9, wherein the step for forming the bit line and the contact comprises:

forming a first dielectric layer over the substrate to cover the dielectric layer, the bit line contact and the gate structures;

forming a trench in the first dielectric layer such that the trench exposes the bit line contact;

forming an opening in the dielectric layer at the bottom of the trench within the peripheral circuit region, wherein the opening exposes the substrate; and depositing conductive material into the trench and the opening to form a bit line and a contact.

15. The method of claim 9, wherein material constituting the bit line contact comprises doped polysilicon.

16. The method of claim 9, wherein material constituting the bit line comprises tungsten.

* * * * *